(12) United States Patent
Kang et al.

(10) Patent No.: US 6,233,960 B1
(45) Date of Patent: May 22, 2001

(54) SPOT COOLING EVAPORATOR COOLING SYSTEM FOR INTEGRATED CIRCUIT CHIP MODULES

(75) Inventors: Sukhvinder Kang, Rochester, MN (US); Howard Victor Mahaney, Jr., Cedar Park, TX (US); Roger R. Schmidt; Prabjit Singh, both of Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/417,187

(22) Filed: Oct. 12, 1999

(51) Int. Cl.[7] .................................................. F25D 23/12
(52) U.S. Cl. .............................. 62/259.2; 62/3.2; 62/3.7
(58) Field of Search ......................... 62/259.2, 3.2, 62/3.7

(56) References Cited

U.S. PATENT DOCUMENTS

| | | | |
|---|---|---|---|
| 5,028,988 | 7/1991 | Porter et al. ............................. 357/81 |
| 5,142,443 | 8/1992 | Moore, Jr. ............................. 361/385 |
| 5,268,812 | 12/1993 | Conte ...................................... 361/698 |
| 5,349,823 | 9/1994 | Solomon ...................................... 62/6 |
| 5,365,749 | 11/1994 | Porter ...................................... 62/259.2 |
| 5,396,775 | * 3/1995 | Rockenfeller et al. ................. 62/112 |
| 5,404,272 | * 4/1995 | Lebailly et al. ....................... 361/700 |
| 5,463,872 | 11/1995 | Vader et al. ............................ 62/51.1 |
| 5,471,850 | * 12/1995 | Cowans ................................... 62/223 |
| 5,504,924 | 4/1996 | Ohashi et al. ......................... 375/800 |
| 5,740,018 | * 4/1998 | Rumbut, Jr. ........................... 361/720 |
| 6,055,815 | * 8/2000 | Peterson ................................... 62/3.7 |
| 6,094,919 | * 8/2000 | Bhatia ...................................... 62/3.7 |

* cited by examiner

*Primary Examiner*—William Doerrler
*Assistant Examiner*—Mark Shulman
(74) *Attorney, Agent, or Firm*—Floyd Gonzalez Cantor Colburn LLP

(57) ABSTRACT

A cooling assembly for an integrated circuit chip module wherein a spot cooling evaporator is mounted on the hat of the module in a position opposite the integrated chip within the module.

8 Claims, 3 Drawing Sheets

SPOT COOLING EVAPORATOR COOLING SYSTEM FOR INTEGRATED CIRCUIT CHIP MODULES

BACKGROUND OF THE INVENTION

The present invention relates to cooling technology for electronic packaging for computer systems, and, more particularly, relates to cooling arrangements for lowering the temperature of integrated circuit chip modules mounted on a printed circuit board substrate, while avoiding the formation of condensation thereon.

The high circuit densities and operating frequencies in modern integrated circuit devices and multi-chip modules of today's computer systems has resulted in a significant increase in the power dissipated by such chip and module components. No matter how fast one wishes to operate a given electronic circuit chip, there almost always is the potential for running it faster if the chip were to be cooled further and more thermal energy is removed during its operation. This is true of computer processor circuit chips and more particularly of such chips disposed within multi-chip modules that generate significant amounts of heat. Because of the demand to run processor modules at increasingly higher speeds, the clock frequencies at which the devices must operate also increases. Power generation correspondingly rises in proportion to the clock frequency, generating thermal demands in terms of energy which must be removed for faster, safer, and more reliable circuit operation. It is required that cooling arrangements be provided so that the heat generated by the operation of these components be effectively and efficiently removed in order to maintain the temperature of the devices within the limits that will keep the operating parameters of the devices in a predetermined range, and, further, to prevent the damage or destruction of the integrated circuit devices by overheating from the high temperatures generated.

Using refrigeration technology, integrated circuit chips and multi-chip modules readily can be cooled to appropriately low temperatures. In addition, however, to the necessity of cooling to prevent damage from overheating, it is also recognized that cooling offers marked advantages in circuit speed, system throughput, and component reliability. With the advent of CMOS processors for computers, the potential performance improvements obtained by lowering chip temperature are intriguing. It is known that a CMOS circuit is capable of operating at higher clock speeds as the circuit temperature is lowered. Current CMOS chip circuit designs generally perform about two percent faster for each 10° C. the chip temperature is lowered. Accordingly, it would not be unreasonable to achieve a 100° C. reduction in chip temperature with refrigeration techniques as compared to cooling with ambient air, thus achieving a 20% performance improvement. It has been reported that the processor frequencing of a CMOS processor has been improved by nearly threefold by cooling the processor to temperatures around $-200°$ C.

Various techniques for the cooling of integrated circuit electronic devices are known and many have been implemented with success. Some practiced techniques involve conventional methods such as by directing ambient air onto the components to be cooled; by sealing the computer cabinet and refrigerating the interior of the cabinet; as well as by immersing components in coolants such as liquid nitrogen. Individual integrated chip or multi-chip module components also have been cooled through specialized devices such as hollow cold plates which are attached to the components to be cooled. Liquid coolants can be circulated through the hollow cold plates to effect cooling of the attached components.

However, in order to take practical advantage of the performance improvements achievable by lowering integrated chip temperatures to levels, for example, in the range of $-40°$ C. to $-60°$ C., cooling of the electronic components to a temperature below the ambient environment dew point results in condensation problems in that moisture will condense on the cooled components and on the structures and components to which the cooled components may be attached. This condensation can damage and literally destroy the electronic circuitry associated with the integrated chip or multi-chip module and the circuit board on which it is mounted.

Accordingly, a cooling system is needed for an integrated chip or multi-chip module device which can effectively and efficiently reduce the temperature of the device to below ambient dew point without causing damage to the device or contiguous components or circuitry.

SUMMARY OF THE INVENTION

Now, an improved assembly for cooling an integrated circuit (IC) device mounted on a printed circuit board (PCB) within a computer system has been developed whereby cooling of the IC device is efficiently and effectively accomplished while damaging condensation is controlled from forming on the cooled devices as well as the PCB on which the IC device is mounted and other electrical components contiguous to the cooled device. According to the present invention, a cooling assembly is provided which comprises an evaporator unit attached to the top of the hat or cover, of an integrated chip module and in thermal communication with the hat surface. In order to maintain the reduced temperature of the cooled device and isolate the device from the ambient warm environment, the IC module and attached cooling evaporator unit are housed within an insulated enclosure which fully envelops the device and evaporator and is itself bounded around its bottom peripheral edge to the surface of the printed circuit board around the outer perimeter of the module to board interface. The enclosure typically includes walls fabricated from rigid structure foam, such as polyurethane foam, and the like, in order to provide structural integrity as well as a thermal insulative barrier. Typically, such structural foams feature thermal conductivities ranging from about 0.04 to about 0.12 W/m. ° K. While it is critical to cool the IC module to low temperatures, typically in the range of about $-40°$ C. to about $-60°$ C., cooling to such temperatures below ambient dew point presents potential condensation problems on the cooled component as well as structures and other components attached to and around the cooled component.

Accordingly, in order to focus cooling on the IC chips within the module, and, in turn to reduce cooling of the entire IC module hat itself, according to the present invention, a localized, spot cooling evaporator is employed. Since the integrated circuit chip, or multiple IC chips, is thermally coupled to the top of the module hat, which is positioned directly above it, through a high conductivity grease, and the like, a high heat flux capable evaporator attached, and in thermal communication with the top of the hat, and sized and positioned to be directly over the IC chip-to-hat interface, effectively can provide the cooling necessary to drive the chip to the desired low temperatures.

However, by focusing the thermal interface of the evaporator on the IC chip by attaching the evaporator opposite the IC chip and by reducing the interface of the evaporator to correspond to the interface area of the IC chip to the module hat, cooling of the perimeter of the module hat is reduced since the evaporator is removed from communication with the module hat in this perimeter area. In this manner, conduction of low temperatures to the perimeter of the hat and, in turn, down to the printed circuit board on which the module is mounted, is reduced. Condensation on the printed circuit board thus is controlled. To further reduce thermal conduction losses through the perimeter of the module hat down to the printed circuit board, the conductivity of the material from which the module hat is fabricated also can be reduced. Typically, module hats are made from materials such as aluminum, copper, copper tungsten, and the like. Such materials have thermal conductivity ranging from 180 to about 400 W/m. ° K. Because of the use of the spot cooling evaporator pursuant to the present concept, the module hats can be made from a lower conductivity material such as anisotrophic graphite epoxy, and the like. These materials have low conductivities in the xy direction ranging from about 1 to about 5 W/m. ° K, and 500 to 1000 W/m. ° K in the z direction.

The above discussed and other features and advantages of the present invention will be appreciated and understood by those skilled in the art from the following detailed description and drawings.

BRIEF DESCRIPTION OF THE DRAWINGS

Referring now to the drawings in which like elements are numbered alike in the several figures.

DETAILED DESCRIPTION OF THE INVENTION

Figure 1:
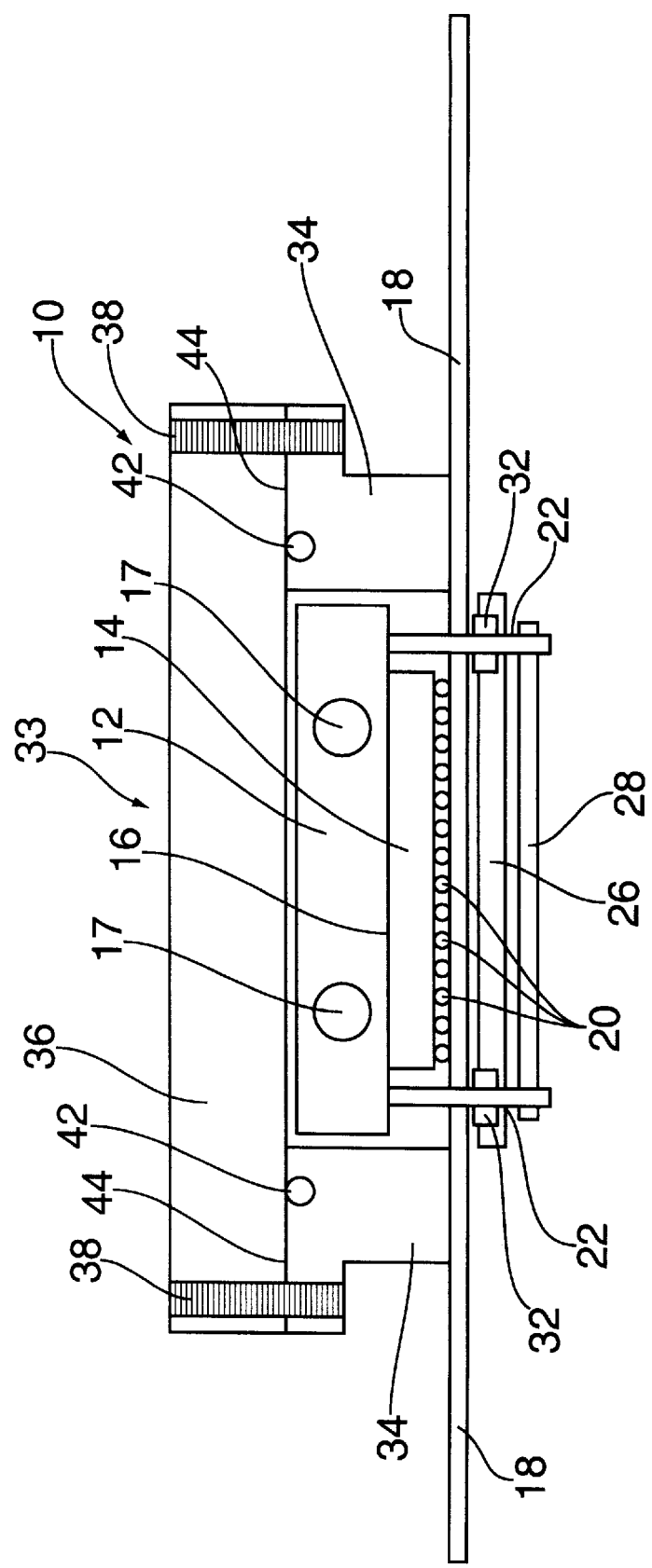
FIG. 1 is a cross-sectional view illustrating an evaporator coded IC module assembly representative of the prior art.

Referring to FIG. 1, a cooling assembly 10, representative of the prior art, shown comprising an evaporator unit 12, which is a thermal block of aluminum or copper, mounted on top of the cover, or hat, of integrated circuit chip module 14 forming a thermal interface through conductive grease layer 16. In operation, coolant fluid from a refrigeration unit (not shown) is circulated through serpentine passages 17, bored or drilled into evaporator block 12, in predetermined pattern. IC module 14 is in electrical communication with printed circuit board 18 via solder ball interconnects 20. The evaporator unit 12 is attached to the printed circuit board 18 by bolts 22, around its periphery, which extend from evaporator 12 and pass through printed circuit and are threaded into stiffener member 26, which serves to reinforce and stiffen the printed circuit board to prevent it from flexing under the stress of the mounted cooling assembly 10, and finally threaded into steel spring plate 28. Rubber O-rings 32 seal around the mounting bolts and help to prevent air leakage into the assembly. In order to insulate the IC module 14 from the warm ambient surroundings, the evaporator-cooled module 14 is fully enclosed within an insulated housing 33 comprising a base number 34 and lid 36. Base 34 is made of a rigid polyurethane foam material, which preferably is molded to the appropriate shape. The bottom of enclosure base number 34 is bonded to the surface of the printed circuit board 18 through a suitable adhesive (not shown). The lid 36, which is separate and removable from base 34 in order to provide service access to IC module 14, also is made from a rigid polyurethane foam and is attached to the base by threaded connectors 38. To ensure an airtight seal between the lid 36 and base 34, an O-ring 42 is set around the interface of the lid 36 and base 34, along with a layer of grease 44.

Cooling of the IC module to typical temperatures in the range of –40° C. to –60° C. readily could introduce condensation problems on the outer surface of the insulated housing, as well as other structures and electrical components which are nearby or to which the IC module is attached. Accordingly, it is desirable to maintain the inside of the enclosure as cold as possible while the outside of the enclosure is maintained warm, above ambient environment dew point. The lid 36 and base 34 of the housing enclosure is made of insulating material, such as a rigid polyurethane foam.

Figure 2:
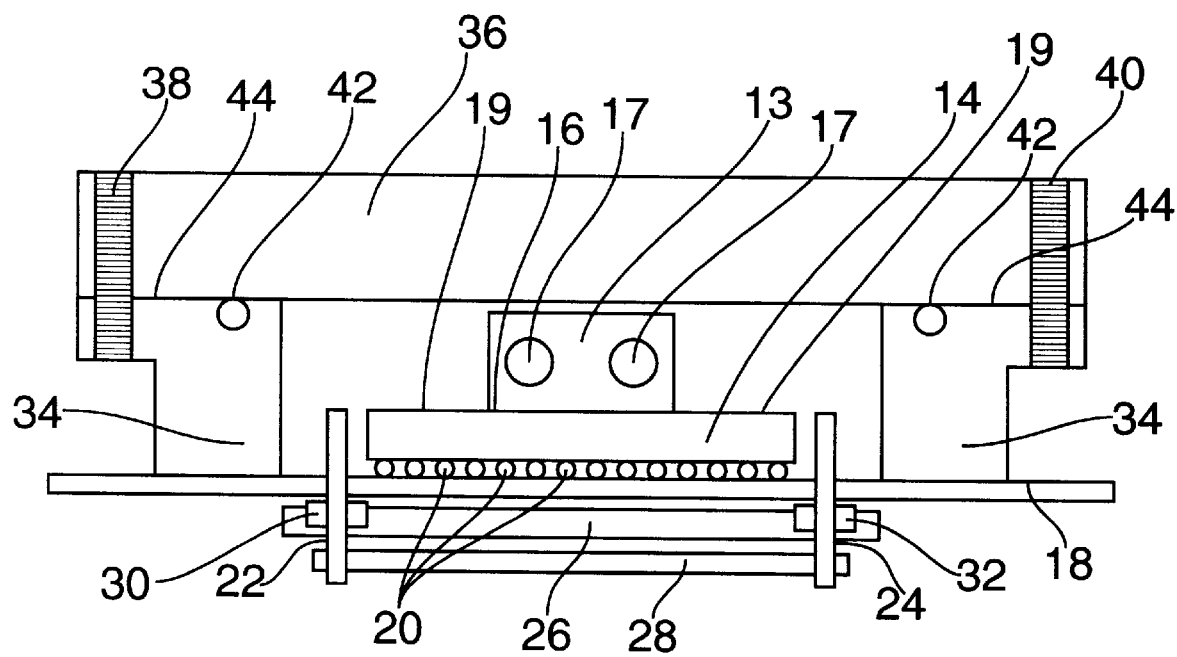
FIG. 2 is a cross-sectional view illustrating an embodiment of an evaporator coded IC module assembly pursuant to the present invention.

FIG. 2 depicts an embodiment of the present invention in which a spot cooling evaporator 13 is attached to the top of the hat of module 14. The evaporator 13 does not cover the entire top surface of the hat, as shown in the prior art assembly of FIG. 1, but rather is sized and positioned over the area in which the IC chip within the module 14 is positioned. In this manner, the evaporator cooling is focused on the heat generating IC chip, and the perimeter 19 of the module hat is not directly in contact with the cooling evaporator 13. Accordingly, cooling of the perimeter 19 of the hat is reduced and the reduction of thermal conduction losses through the perimeter 19 of the hat down to the printed circuit board 18 helps control the occurrence of condensation on the board 18.

Figure 3:
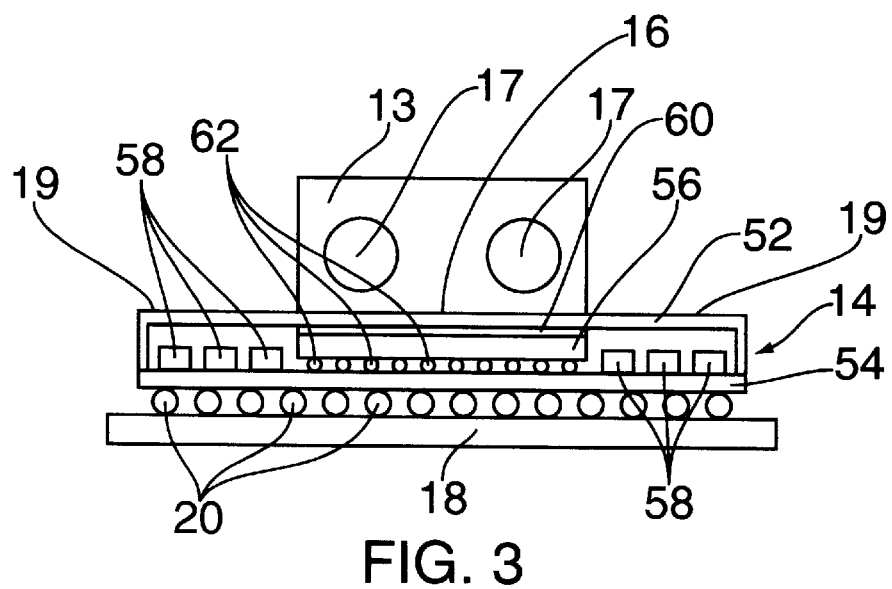
FIG. 3 is a cross-sectional view illustrating an evaporator coded IC module showing the internal arrangement of an IC chip within the module.

FIG. 3 is a cross-sectional view of a partial cooling assembly, showing, in simplified form, the internal structure of an evaporator cooled IC module. The IC chip module 14 comprises an enclosure consisting of hat 52 and substrate base 54, and internal components consisting of integrated circuit chip 56 and capacitors 58. Integrated circuit chip 56 is thermally coupled to the inner surface of the module hat 52 through a layer of high conductivity grease 60, and is electrically connected to the module substrate base 54 through solder ball connections 62. The spot cooling evaporator 13 is positioned directly over the integrated chip 56 and is mounted on the top of hat 52 through a thermal interface 16 of high conductivity grease. The interface footprint of the evaporator 13 and the module hat 52 is seen to correspond to the interface footprint of the IC chip 56 and the module hat 52.

Figure 4:
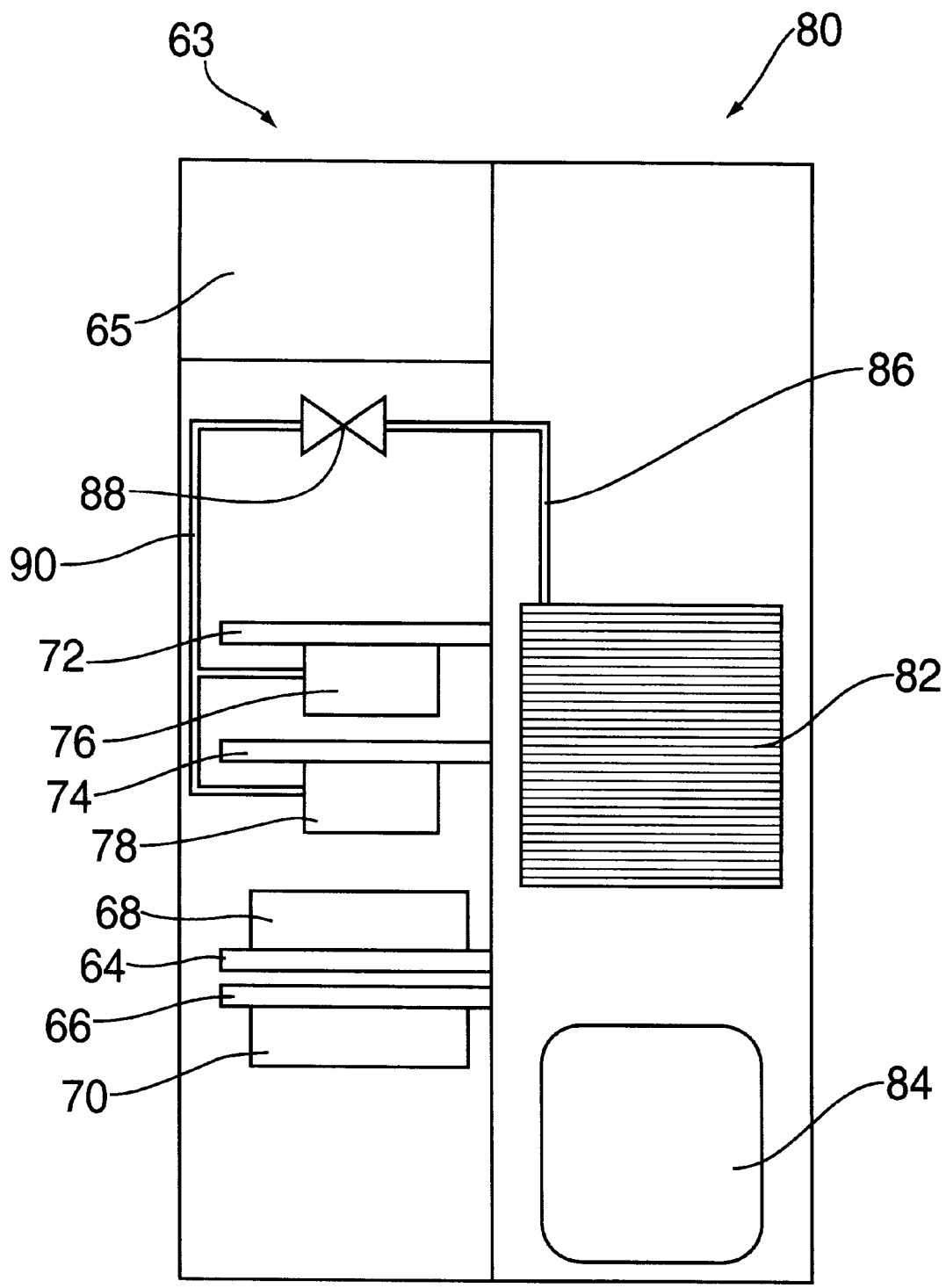
FIG. 4 is a simplified front view of depicting the arrangement of components in a typical workstation processor unit with a sidecar refrigeration system.

FIG. 4 is a simplified front view showing the arrangement of components in a typical computer workstation processor unit 63 wherein one or more integrated circuit chip modules is cooled through a refrigerated evaporator unit. The processor unit 63 consists of a power supply 65, memory cards 64 and 66, to which component modules 68 and 70 are mounted, and processor cards 72 and 74, to which evaporator cooled processor integrated chip modules enclosed within insulated housings 76 and 78 are mounted. Mated next to the processor unit 63 is sidecar refrigeration unit 80 which provides cooling for processor unit 63. Refrigeration unit 80 consists of condenser 82 and compressor 84, interconnected with appropriate hosing and conduits (not shown) and connected through flexible refrigerant line 86 with quick connect coupling 88 to refrigerant distribution hose 90. Distribution hose 90 conducts coolant to the evaporator blocks within insulated housings 76 and 78 to cool the enclosed IC modules While the invention has been described with reference to specific embodiments thereof, it is intended that all matter contained in the above description is shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention as defined in the amended claims.

We claim:

1. A cooling system for an integrated circuit chip module mounted on a printed circuit board substrate comprising:

an integrated circuit chip enclosed within a module and in thermal communication with the inside surface of the hat of said module; and, a cooling evaporator attached to the top of said hat, and having a thermal interface in thermal communication with the outside surface of the top of said hat and positioned in a manner to focus its thermal interface on the top side of the hat opposite the position of the integrated circuit chip within the module.

2. The cooling system of claim 1 wherein the cooling evaporator is sized and positioned in a manner corresponding to the size and position of the integrated circuit chip within said module.

3. The cooling system of claim 1 wherein the module is enclosed within an insulated housing having its base attached to said printed circuit board substrate surrounding the outer perimeter of said module.

4. The cooling system of claim 3 wherein the hat of said module extends beyond the perimeter of the interface between the evaporator and the module hat so that the evaporator is not in direct thermal communication with the perimeter of the hat.

5. The cooling system of claim 1 wherein the module hat is a material having a thermal conductivity ranging from about 180 to about 400 W/m. ° K.

6. The cooling system of claim 5 wherein the module hat is a material having a thermal conductivity ranging from about 1 to about 5 W/m. ° K in the xy direction, and 500 to 1000 W/m. ° K in the z direction.

7. The cooling system of claim 5 wherein the module hat is a material selected from the group consisting of copper, copper tungsten, and the like.

8. The cooling system of claim 6 wherein the module hat is made from an anisotropic graphite epoxy material.

* * * * *